United States Patent
Han et al.

(10) Patent No.: US 9,768,346 B2
(45) Date of Patent: Sep. 19, 2017

(54) LIGHT-EMITTING DEVICE

(71) Applicant: LG INNOTEK CO., LTD., Seoul (KR)

(72) Inventors: Dae Seob Han, Seoul (KR); Yong Tae Moon, Seoul (KR); Kwang Sun Baek, Seoul (KR); A Ra Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/437,433

(22) PCT Filed: Oct. 22, 2013

(86) PCT No.: PCT/KR2013/009437
§ 371 (c)(1),
(2) Date: Apr. 21, 2015

(87) PCT Pub. No.: WO2014/065571
PCT Pub. Date: May 1, 2014

(65) Prior Publication Data
US 2015/0287876 A1    Oct. 8, 2015

(30) Foreign Application Priority Data

Oct. 22, 2012  (KR) .......................... 10-2012-0117081

(51) Int. Cl.
*H01L 33/06* (2010.01)
*H01L 33/04* (2010.01)
(Continued)

(52) U.S. Cl.
CPC .............. *H01L 33/06* (2013.01); *H01L 33/04* (2013.01); *H01L 33/24* (2013.01); *H01L 33/32* (2013.01);
(Continued)

(58) Field of Classification Search
CPC ....... H01L 33/06; H01L 33/325; H01L 33/24; H01L 33/0025; H01L 33/62; H01L 33/30;
(Continued)

(56) References Cited

U.S. PATENT DOCUMENTS 8,816,319 B1 *   8/2014  Raring ................... H01L 33/06
                                                257/13
2007/0063207 A1*  3/2007  Tanizawa ............... B82Y 20/00
                                                257/94
(Continued)

FOREIGN PATENT DOCUMENTS

CN    102544277 A    7/2012
CN    102623599 A    8/2012
(Continued)

OTHER PUBLICATIONS

U.S. Appl. No. 14/434,383, filed Apr. 8, 2015.

*Primary Examiner* — Galina Yushina
(74) *Attorney, Agent, or Firm* — Birch, Stewart, Kolasch & Birch, LLP

(57) ABSTRACT

A light-emitting device and a lighting system includes a first conductivity type semiconductor layer, a gallium nitride-based super lattice layer on the first conductivity type semiconductor layer, an active layer, on the gallium nitride-based super lattice layer, a second conductivity type gallium nitride-based layer on the active layer, and a second conductivity type semiconductor layer, on the second conductivity type gallium nitride-based layer. The second conductivity type gallium nitride-based layer can include a second conductivity type $Al_xGa_{(1-x)}N/Al_yGa_{(1-y)}N$, such as $Al_xGa_{(1-x)}N/Al_yGa_{(1-y)}N$, on the active layer.

6 Claims, 8 Drawing Sheets

(51) Int. Cl.
*H01L 33/32* (2010.01)
*H01L 33/24* (2010.01)

(52) U.S. Cl.
CPC .. *H01L 33/325* (2013.01); *H01L 2224/48091* (2013.01)

(58) Field of Classification Search
CPC ..... H01L 33/007; H01L 33/075; H01L 33/04; H01L 33/32; H01L 29/122; H01L 29/125; H01L 29/15; H01L 29/158; H01L 29/786689; H01L 2224/48–2224/01; H01L 21/02507
See application file for complete search history.

(56) References Cited

U.S. PATENT DOCUMENTS

| | | | |
|---|---|---|---|
| 2008/0054252 A1* | 3/2008 | Eichler | B82Y 20/00 257/22 |
| 2008/0251781 A1 | 10/2008 | Han et al. | |
| 2011/0168977 A1* | 7/2011 | Eichler | H01S 5/34333 257/13 |
| 2012/0043526 A1* | 2/2012 | Moon | H01L 33/06 257/13 |

FOREIGN PATENT DOCUMENTS

| | | |
|---|---|---|
| JP | 2001-210861 A | 8/2001 |
| JP | 4815732 B2 | 11/2011 |
| KR | 10-0835116 B1 | 6/2008 |
| KR | 10-2009-0058364 A | 6/2009 |
| KR | 10-0979701 B1 | 9/2010 |

\* cited by examiner

【FIG. 1】
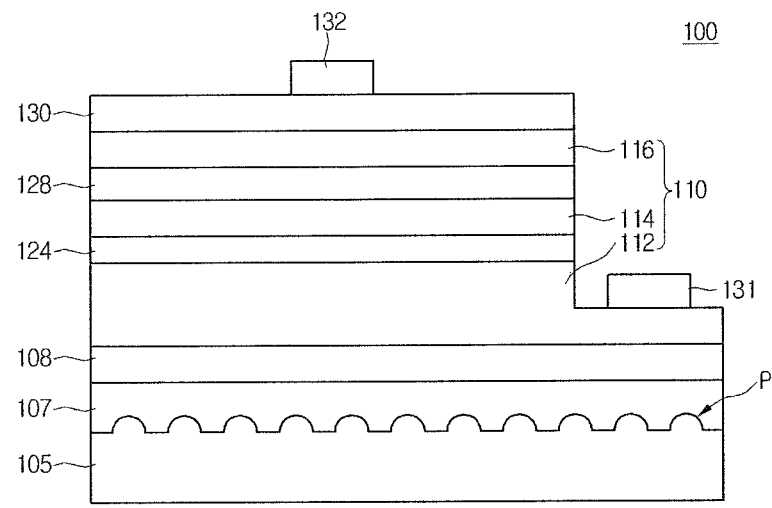
【FIG. 2】
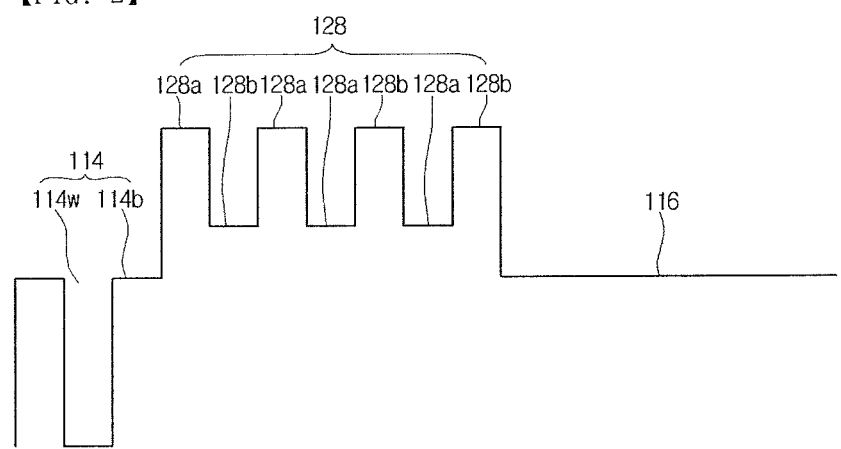

[FIG. 5]
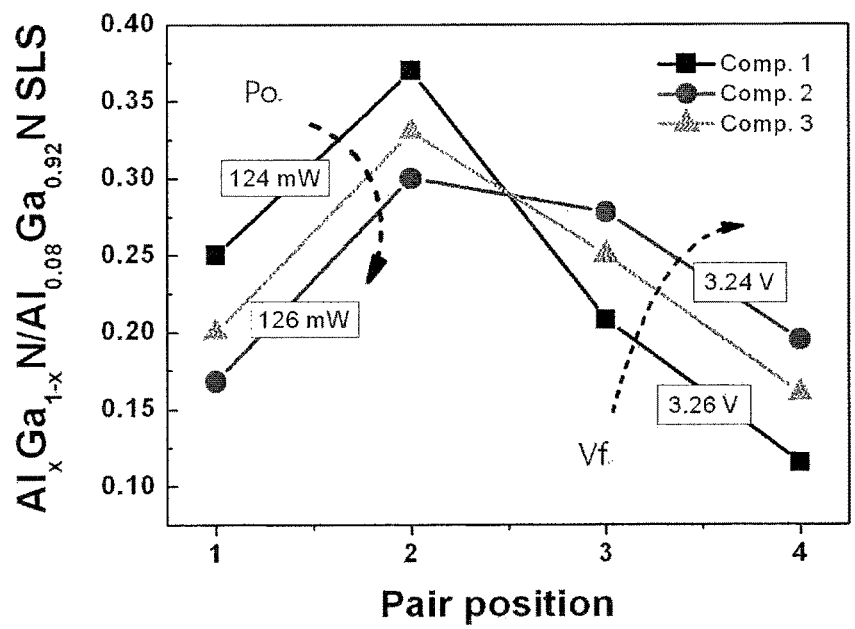
[FIG. 6]
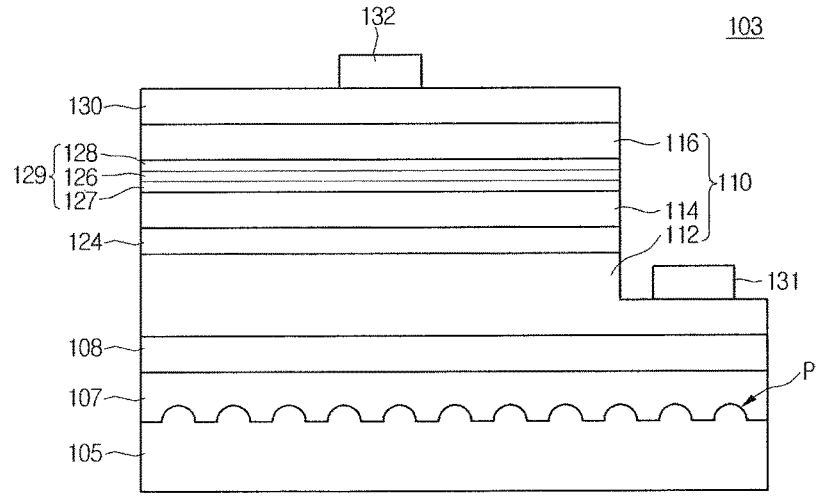

[FIG. 7]
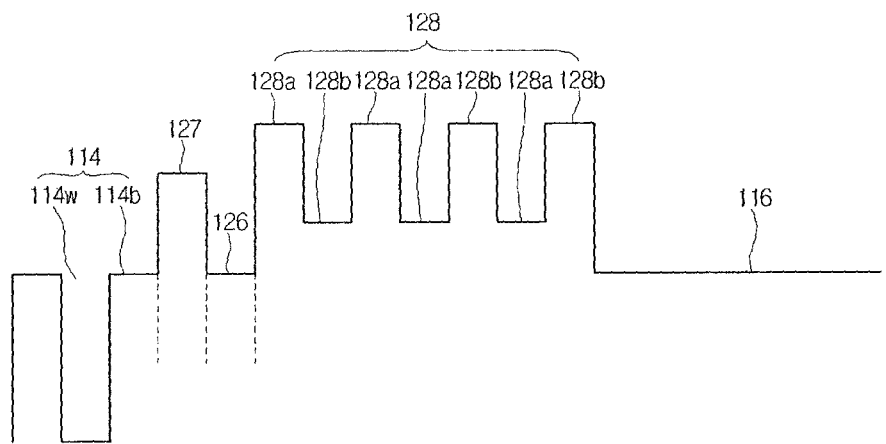
[FIG. 8]
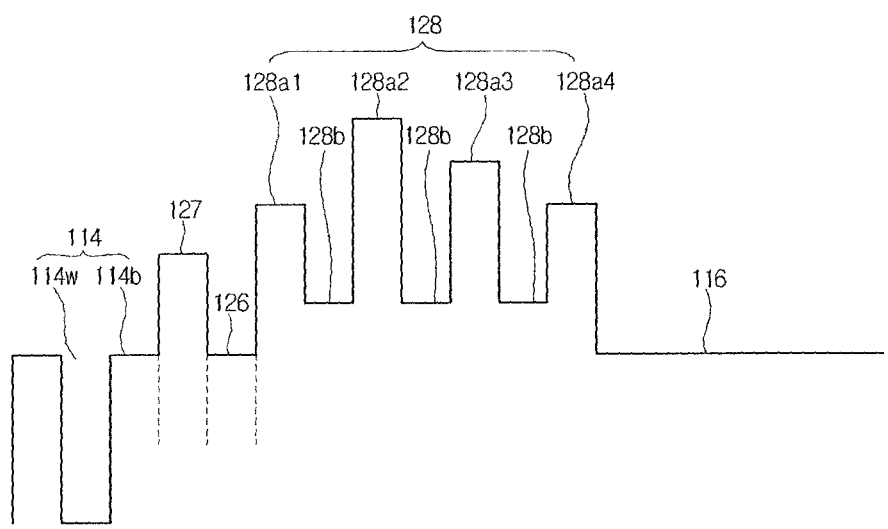

[FIG. 9]
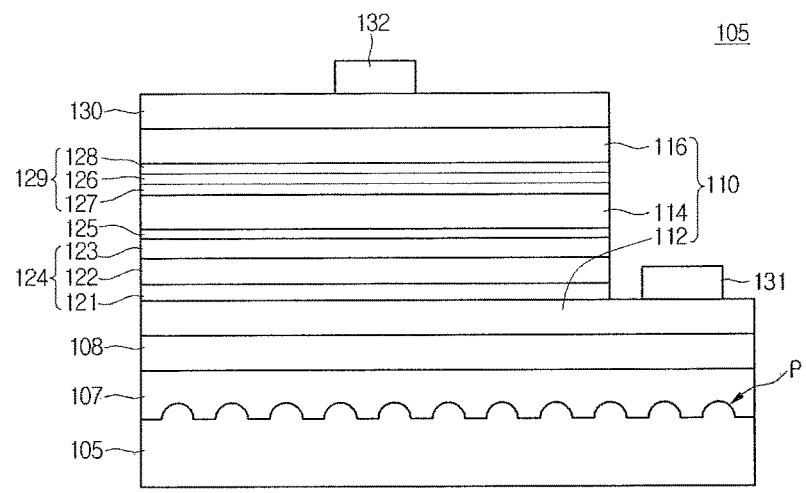
[FIG. 10]
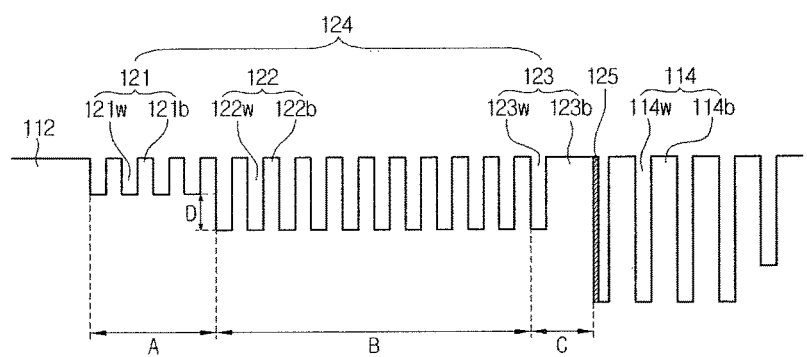

[FIG. 11]
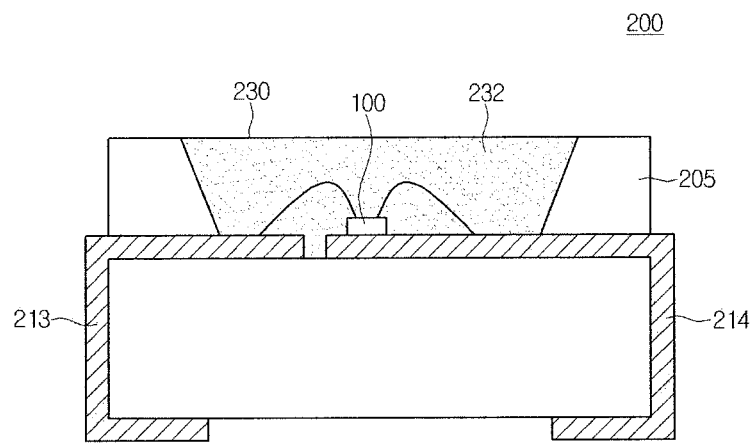
[FIG. 12]
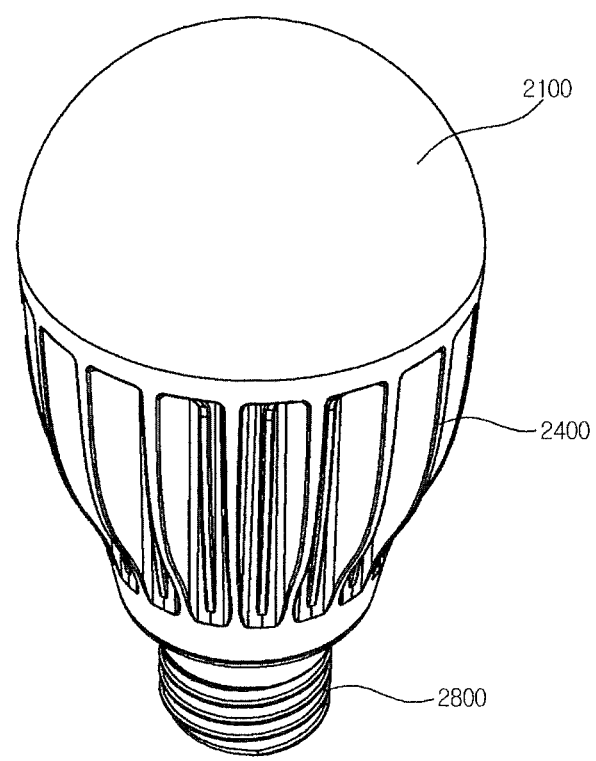

[FIG. 13]
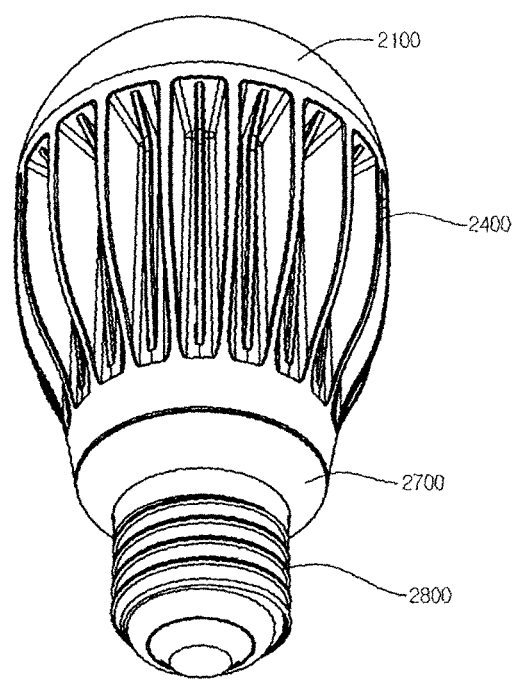

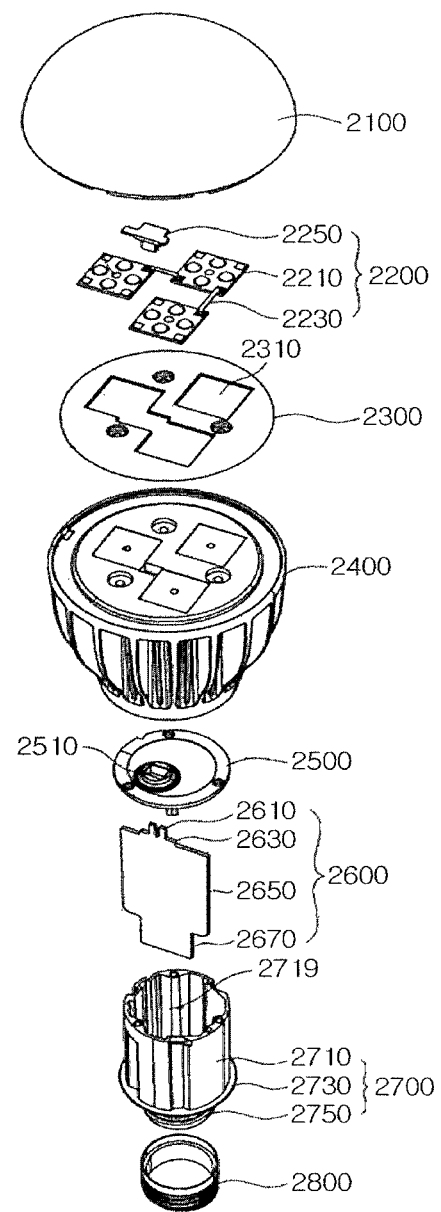
[FIG. 14]

LIGHT-EMITTING DEVICE

TECHNICAL FIELD

The embodiment relates to a light-emitting device, a method of manufacturing the same, a light-emitting device package, and a lighting system.

BACKGROUND ART

A light-emitting device includes a P-N junction diode having a characteristic of converting electrical energy into light energy. The light-emitting device may include compound semiconductors belonging to group III and V on the periodic table. The light-emitting device can represent various colors by adjusting the compositional ratio of the compound semiconductors.

When forward voltage is applied to the light-emitting device, electrons of an N layer are combined with holes of a P layer, so that energy corresponding to an energy gap between a conduction band and a valance band may be generated. The energy is mainly emitted in the form of heat or light. In the case of the light-emitting device, the energy is generated in the form of light.

For example, a nitride semiconductor represents superior thermal stability and wide bandgap energy so that the nitride semiconductor has been spotlighted in the field of optical devices and high-power electronic devices. In particular, blue, green, and ultraviolet (UV) light-emitting devices employing the nitride semiconductor have already been commercialized and extensively used.

Recently, as the demand for a high-efficiency light-emitting device is increased, the enhancement of light intensity has been issued.

In order to enhance the light intensity, various attempts have been carried out to improve the structure of an active layer (MQW), an electron blocking layer (EBL), and a lower layer of the active layer, and good results are not obtained.

DISCLOSURE

Technical Problem

The embodiment relates to a light-emitting device, capable of enhancing light intensity, a method of manufacturing the same, a light-emitting device package, and a lighting system.

Technical Solution

According to the present invention, there is provided a light-emitting device including a first conductivity type semiconductor layer (112); a gallium nitride-based superlattice layer (124) on the first conductivity type semiconductor layer (112); an active layer (114) on the gallium nitride-based superlattice layer (124); a second conductive gallium nitride-based layer on the active layer (114); and a second conductivity type semiconductor layer (116) on the second conductive gallium nitride-based layer. The second conductive gallium nitride-based layer may include a second conductive $Al_xGa_{(1-x)}N/Al_yGa_{(1-y)}N$ superlattice layer (where, $0<x<1$, $0<y<1$) (128) on the active layer (114).

Advantageous Effects

According to the embodiment, the light-emitting device having the optimal structure capable of enhancing the light intensity, the method of manufacturing the same, the light-emitting device package, and the lighting system can be provided.

DESCRIPTION OF DRAWINGS

FIG. 1 is a sectional view showing a light-emitting device according to a first embodiment.

FIG. 2 is a view sowing an example of an energy band diagram of the light-emitting device according to the first embodiment.

FIG. 5 is a graph showing light intensity (Po) and operating voltage (Vf) according to the embodiment.

FIG. 6 is a sectional view showing a light-emitting device according to a third embodiment.

FIG. 7 is a view showing an example of the energy band diagram of the light-emitting device according to the third embodiment.

FIG. 8 is a view showing an example of an energy band diagram of a light-emitting device according to a fourth embodiment.

FIG. 9 is a sectional view showing a light-emitting device according to a fifth embodiment.

FIG. 10 is a view showing an example of an energy band diagram of the light-emitting device according to the fifth embodiment.

FIG. 11 is a sectional view showing a light-emitting device package having the light-emitting device according to the embodiment.

FIGS. 12 to 14 are views showing a lighting device according to the embodiment.

BEST MODE

Mode for Invention

Figure 3:
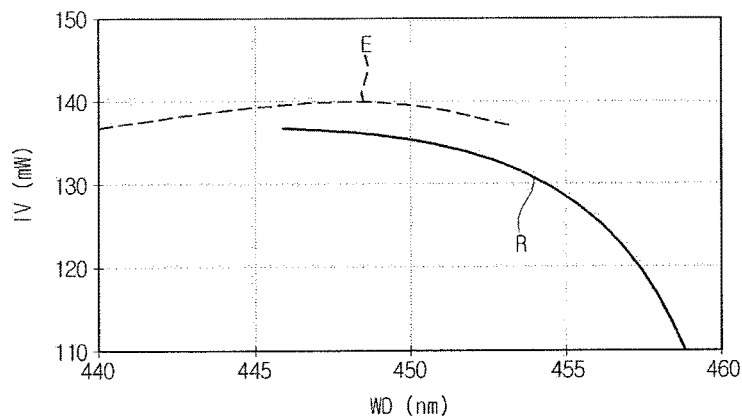
FIG. 3 is a graph showing the variation of light intensity as a function of a wavelength of the light-emitting device according to the first embodiment and a light-emitting device according to a comparative example.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Embodiment

FIG. 1 is a sectional view showing a light-emitting device 100 according to a first embodiment, and FIG. 2 is a view sowing an example of an energy band diagram of the light-emitting device according to the first embodiment.

The light-emitting device 100 according to the embodiment includes a first conductivity type semiconductor layer 112, a gallium nitride-based superlattice layer 124 on the first conductivity type semiconductor layer 112, an active layer 114 on the gallium nitride-based superlattice layer 124, a second conductive gallium nitride-based superlattice layer on the active layer 114, and a second conductivity type semiconductor layer 116 on the second conductive gallium nitride-based superlattice layer.

A substrate 105 may include a material having excellent thermal conductivity, and may include a conductive substrate or an insulating substrate. For example, the substrate 105 may include at least one of sapphire ($Al_2O_3$), SiC, Si, GaAs, GaN, ZnO, GaP, InP, Ge, and $Ga_2O_3$.

According to the embodiment, a light reflection pattern P is provided to enhance light extraction efficiency. For example, a patterned sapphire substrate (PSS) may be formed on the substrate 105 to enhance the light extraction efficiency.

In addition, according to the embodiment, a buffer layer 107 and an undoped semiconductor layer 108 are formed on the substrate 105 to reduce the lattice mismatch between a material of the light emitting structure 110 and a material of the substrate 105. For example, the buffer layer 107 may be formed of group III-V compound semiconductors, for example at least one of GaN, InN, AlN, InGaN, AlGaN, InAlGaN, and AlInN, but the embodiment is not limited thereto.

Then, a first conductivity type semiconductor layer 112 is formed on the undoped semiconductor layer 108. For example, the first conductivity type semiconductor layer 112 may include a semiconductor material having a compositional formula of $In_xAl_yGa_{1-x-y}N$ ($0 \le x \le 1$, $0 \le y \le 1$, $0 \le x+y \le 1$). In detail, the first conductivity type semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP, but the embodiment is not limited thereto.

According to the embodiment, the gallium nitride-based superlattice layer 124 may be formed on the first conductivity type semiconductor layer 112. The gallium nitride-based superlattice layer 124 may effectively reduce the stress caused by lattice mismatch between the first conductivity type semiconductor layer 112 and the active layer 114.

According to the embodiment, the active layer 114 may include at least one of a single quantum well structure, a multi quantum well (MQW) structure, a quantum wire structure, and a quantum dot structure.

The well layer 114w/barrier layer 114b of the active layer 114 may include at least one of InGaN/InGaN, GaN/AlGaN, InAlGaN/GaN, GaAs(InGaAs)/AlGaAs, GaP(InGaP)/AlGaP pair structures, but the embodiment is not limited thereto. The well layer may be formed of material having a bandgap lower than a bandgap of the barrier layer.

According to the embodiment, a light-emitting device having the optimal structure capable of improving light intensity is provided.

According to nitride-based compounds of the related art, the mobility of electrons is greater than that of holes. Accordingly, electrons pass a multi-quantum well structure faster than holes to reach a P type nitride semiconductor layer. In other words, the electrons may flow into the P type nitride semiconductor layer without being recombined with the holes. To prevent the phenomenon and confine the electrons within the multi-quantum well structure, an AlGaN-based electron blocking layer (EBL) is generally used.

However, since the AlGaN-based electron blocking layer has higher energy bandgap, the AlGaN-based electron blocking layer interrupts holes introduced into the multi-quantum well structure to increase forward voltage.

To solve the above problem, in the light-emitting device 100 according to the embodiment, the second conductive gallium nitride-based superlattice layer may include a second conductive $Al_xGa_{(1-x)}N/Al_yGa_{(1-y)}N$ superlattice layer (where, $0<x<1$, $0<y<1$) 128.

According to the embodiment, in the second conductive $Al_xGa_{(1-x)}N/Al_yGa_{(1-y)}N$ superlattice layer 128, the concentration (x) of Al in $Al_xGa_{(1-x)}N$ may be greater than the concentration (y) of Al in $Al_yGa_{(1-y)}N$. The second conductive $Al_xGa_{(1-x)}N//Al_yGa_{)1-y)}N$ superlattice layer 128 may have an energy bandgap greater than or equal to that of the quantum well 114b of the active layer.

The second conductive $Al_xGa_{(1-x)}N/Al_yGa_{(1-y)}N$ superlattice layer 128 may have a plurality of cycles, and the concentration (x) of Al in $Al_xGa_{(1-x)}N$ and the concentration (y) of Al in $Al_yGa_{(1-y)}N$ may be constant.

For example, the second conductive $Al_xGa_{(1-x)}N/Al_yGa_{(1-y)}N$ superlattice layer 128 may have about three cycles or five cycles, the concentration (x) of Al in $Al_xGa_{(1-x)}N$ may be in $0.20 \le x \le 0.30$, and the concentration (y) of Al in $Al_yGa_{(1-1)}N$ may be in $0.05 \le x \le 0.10$, but the embodiment is not limited thereto.

In the second conductive $Al_xGa_{(1-x)}N/Al_yGa_{(1-y)}N$ superlattice layer 128, the $Al_xGa_{(1-x)}N$ layer and the $Al_yGa_{(1-y)}N$ layer may be formed at the thickness in the range of about 5 mm to 7 mm, but the embodiment is not limited thereto.

FIG. 3 is a graph showing the variation of light intensity E as a function of a wavelength WD of the light-emitting device according to the first embodiment and the variation of light intensity R as a function of the wavelength WD of a light-emitting device according to a comparative example.

In FIG. 3, in the light-emitting device according to the embodiment, the quantum well 114w and the quantum well 114b of the active layer 114 employ 7-cycle MQWs, and the second conductive $Al_xGa_{(1-x)}N/Al_yGa_{(1-y)}N$ superlattice layer 128 has four cycles, but the embodiment is not limited thereto.

In the comparative example of FIG. 3, 7-cycle MQWs are employed for the quantum well and the quantum barrier of the active layer, and a conventional AlGaN-based electron blocking layer is employed as the electron blocking layer.

According to the light-emitting device of the embodiment, the second conductive $Al_xGa_{(1-x)}N/Al_yGa_{(1-y)}N$ superlattice layer 128 may be provided to improve the light intensity. In detail, the defect merging of the active layer is possible in the second conductive $Al_xGa_{(1-x)}N/Al_yGa_{(1-y)}N$ superlattice layer 128, so that the intensity of long-wavelength light can be improved through strain relaxing.

In addition, according to the embodiment, the cycle of the active layer is increased to five pairs to seven pairs, so that an actively volume is increased to effectively reduce series resistance even if the light emission efficiency is increased, so that the light intensity can be improved.

Figure 4:
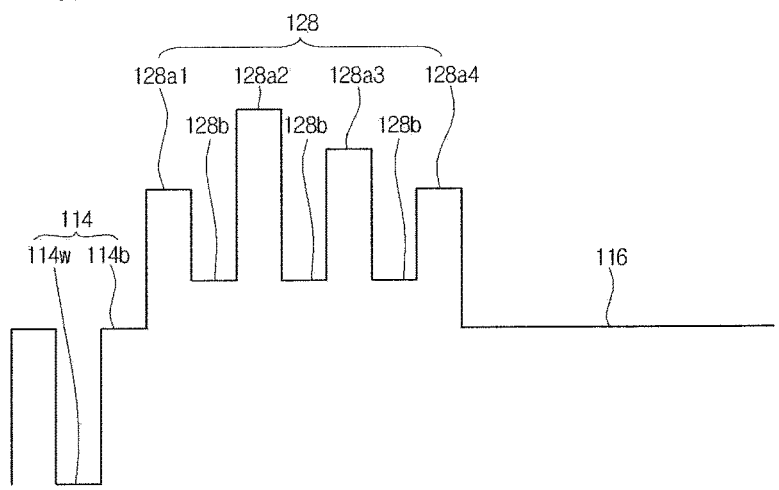
FIG. 4 is a view sowing an example of an energy band diagram of a light-emitting device according to a second embodiment.

FIG. 4 is a view sowing an example of an energy band diagram of a light-emitting device according to a second embodiment.

The second embodiment may employ a technical feature of the first embodiment, and the following embodiment will be described while focusing on the main feature of the second embodiment.

According to the second embodiment, the second conductive $Al_xGa_{(1-x)}N/Al_yGa_{(1-y)}N$ superlattice layer 128 may have a plurality of cycles, the concentration (x) of each Al in each $Al_xGa_{(1-x)}N$ may be increased and then decreased from the active layer 114 toward the second conductivity type semiconductor 116 from the active layer 114, and the concentration (y) of Al in the $Al_yGa_{(1-1)}N$ may be constant.

For example, the second conductive $Al_xGa_{(1-1)}N/Al_yGa_{(1-y)}N$ superlattice layer 128 may include a second-conductive first $Al_{x1}Ga_{(1-x1)}N/Al_yGa_{(1-y)}N$ superlattice layer 128a1/128b, a second-conductive second $Al_{x2}Ga_{(1-x2)}N/Al_yGa_{(1-y)}N$ superlattice layer 128a2/128b, a second-conductive third $Al_{x3}Ga_{(1-x3)}N/Al_yGa_{(1-y)}N$ superlattice layer 128a3/128b, and a second-conductive fourth $Al_{x4}Ga_{(1-x4)}N/Al_yGa_{(1-y)}N$ superlattice layer 128a4/128b that are sequentially laminated, but the embodiment is not limited thereto.

For example, as shown in FIG. 4, the concentration (x1) of Al in $Al_{x1}Ga_{(1-x1)}N$ 128a1 of the second-conductive first $Al_{x1}Ga_{(1-x1)}N/Al_yGa_{(1-y)}N$ superlattice layer 128a1/128b may be lower than the concentration (x2) of Al in $Al_{x2}Ga_{(1-x2)}N$ 128a2 of the second-conductive second $Al_{x2}Ga_{(1-x2)}N/Al_yGa_{(1-y)}N$ superlattice layer 128a2/128b.

In addition, the concentration (x4) of Al in $Al_{x4}Ga_{(1-x4)}N$ of the second-conductive fourth $Al_{x4}Ga_{(1-x4)}N/Al_yGa_{(1-y)}N$ superlattice layer 128a4/128b may be lower than the concentration (x3) of Al in $Al_{x3}Ga_{(1-x3)}N$ of the second-conductive third $Al_{x3}Ga_{(1-x3)}N/Al_yGa_{(1-y)}N$ superlattice layer 128a3/128b.

FIG. 5 is a graph showing light intensity (Po) and operating voltage (Vf) according to the embodiment.

According to the embodiment, in the concentration (x1) of Al in the $Al_{x1}Ga_{(1-x1)}N$ and the concentration (x2) of Al in the $Al_{x2}Ga_{(1-x2)}N$, as the composition of Al is reduced, the light intensity of a chip (Chip Po) is enhanced and the operating voltage (Vf) is lowered. In the concentration (x3) of Al in the $Al_{x3}Ga_{(1-x3)}N$ and the concentration (x4) of Al in the $Al_{x4}Ga_{(1-x4)}N$, as the composition of Al is increased, the light intensity of a chip (Chip Po) is enhanced and the operating voltage (Vf) is lowered. Accordingly, an experimental example (Comp.3) may be the optimal embodiment among three experimental examples (Comp.1, Comp.2, and Comp.3) shown in FIG. 5, but the embodiment is not limited thereto.

According to the embodiment, the concentration of Al in each of $Al_{x1}Ga_{(1-x1)}N$, $Al_{x2}Ga_{(1-x2)}N$, $Al_{x3}Ga_{(1-x3)}N$, and $Al_{x4}Ga_{(1-x4)}N$ may be greater than 8%.

According to the embodiment, the second conductive $Al_xGa_{(1-x)}N/Al_yGa_{(1-y)}N$ superlattice layer 128 has a plurality of cycles, and the concentration (x) of each Al of each $Al_xGa_{(1-x)}N$ is controlled to be reduced toward the second conductivity type semiconductor layer 116 from the active layer 114, thereby increasing the mobility of holes to lower the operating voltage (Vf), and efficiently blocking electrons to improve a low-current leakage characteristic and increase the light intensity.

FIG. 6 is a sectional view showing a light-emitting device according to a third embodiment, FIG. 7 is a view showing an example of the energy band diagram of the light-emitting device according to the embodiment, and FIG. 8 is a view showing an example of an energy band diagram of a light-emitting device according to a fourth embodiment.

The third and fourth embodiments may employ the technical features of the first and second embodiments. The following description will be made while focusing on the technical features of the third and fourth embodiments.

According to the third and fourth embodiments, a second conductive gallium nitride-based layer 129 may include a second conductive $In_xAl_yGa_{(1-x-y)}N$ layer (where, 0<x<1, 0<y<1) 127 having a second concentration of second conductive impurities on the active layer 114, a second conductive GaN layer 126 having a first concentration of second conductive impurities on the second conductive $In_xAl_yGa_{(1-x-y)}N$ layer 127 having the second concentration of second conductive impurities, and the second conductive $Al_xGa_{(1-x)}N/Al_yGa_{(1-y)}N$ superlattice layer 128 on the second conductive GaN layer 126 having the first concentration of second conductive impurities.

The second conductive $Al_xGa_{(1-x)}N/Al_yGa_{(1-y)}N$ superlattice layer 128 may be the second conductive $Al_xGa_{(1-x)}N/Al_yGa_{(1-y)}N$ superlattice layer 128 having a third concentration of second conductive impurities. The first concentration of second conductive impurities may be higher than the second concentration of second conductive impurities and the third concentration of second conductive impurities.

According to the embodiment, the lattice mismatch between the active layer 114 and the second conductive $Al_xGa_{(1-x)}N/Al_yGa_{(1-y)}N$ superlattice layer 128 having the third concentration of second conductive impurities may be reduced by the second conductive $In_xAl_yGa_{(1-x-y)}N$ layer 127 having the second concentration of second conductive impurities, and the thermal dissociation of the active layer 114 can be prevented. The second conductive $Al_zGa_{(1-z)}N$ 128 having the third concentration of second conductive impurities can more efficiently block electrons.

According to the third and fourth embodiment, the second conductive $In_xAl_yGa_{(1-x-y)}N$ layer 127 having the second concentration of second conductive impurities may be provided closer to the active layer 114 than the second conductive $Al_zGa_{(1-z)}N$ layer 128 having the third concentration of second conductive impurities.

Therefore, the second conductive GaN layer 126 having the first concentration of second conductive impurities may be interposed between the second conductive $In_xAl_yGa_{(1-x-y)}N$ layer 127 having the second concentration of second conductive impurities and the second conductive $Al_zGa_{(1-z)}N$ 128 having the third concentration of second conductive impurities.

As described above, the second conductive GaN layer 126 having the first concentration of second conductive impurities is interposed between the second conductive $In_xAl_yGa_{(1-x-y)}N$ layer 127 having the second concentration of second conductive impurities and the second conductive $Al_zGa_{(1-z)}N$ layer 128 having the third concentration of second conductive impurities in such a manner that the first concentration of second conductive impurities is higher than the second concentration of second conductive impurities and the third concentration of second conductive impurities, thereby solving a problem that doping concentration may not be increased in the process of forming the first conductivity type semiconductor layer 112, the second conductive $In_xAl_yGa_{(1-x-y)}N$ layer 127 having the second concentration of second conductive impurities and the second conductive $Al_zGa_{(1-z)}N$ layer 128 having the third concentration of second conductive impurities.

In other words, in the second conductive $In_xAl_yGa_{(1-x-y)}N$ layer 127 having the second concentration of second conductive impurities and the second conductive $Al_zGa_{(1-z)}N$ layer 128 having the third concentration of second conductive impurities, as the composition of Al is increased, the bonding energy of AlN is increased so that the doping may be difficult. Therefore, the second conductive GaN layer 126 having the first concentration of second conductive impurities representing higher doping concentration is interposed to enhance the light intensity and lower the operating voltage.

In addition, as compared with when only both of the second conductive $In_xAl_yGa_{(1-x-y)}N$ layer 127 having the second concentration of second conductive impurities and the second conductive $Al_zGa_{(1-z)}N$ layer 128 having the third concentration of second conductive impurities are used, when the second conductive GaN layer 126 having the first concentration of second conductive impurities is systematically bonded with the second conductive $In_xAl_yGa_{(1-x-y)}N$ layer 127 having the second concentration of second conductive impurities and the second conductive $Al_zGa_{(1-z)}N$ layer 128 having the third concentration of second conductive impurities, the second conductive GaN layer 126 having the first concentration of second conductive impurities representing higher doping concentration can more sufficiently provide holes to the active layer 114. Accordingly, the operating voltage of the light-emitting device is lowered, and an amount of heat emitted from the light-emitting device can be reduced.

FIG. 9 is a sectional view showing a light-emitting device according to a fifth embodiment.

According to the fifth embodiment, the gallium nitride-based superlattice layer 124 may have a bandgap energy level which varies from the first conductivity type semiconductor layer 112 toward the active layer 114.

For example, the bandgap energy level of the gallium nitride-based superlattice layer 124 may be reduced in the form of a step from the first conductivity type semiconductor layer 112 toward the active layer 114, but the embodiment is not limited thereto.

For example, the gallium nitride-based superlattice layer 124 may include a first-group gallium nitride-based superlattice layer 121 having first bandgap energy at an area A adjacent to the first conductivity type semiconductor layer 112 and a second-group gallium nitride-based superlattice layer 122 having second bandgap energy lower than the first bandgap energy on the first-group gallium nitride-based superlattice layer 121 (area B)

In addition, the gallium nitride-based superlattice layer 124 may further include a third-group gallium nitride-based superlattice layer 123 having third bandgap energy provided on the second-group gallium nitride-based superlattice layer 122 at an area C adjacent to the active layer 114.

The third bandgap energy may be equal to or lower than the second bandgap energy, but the embodiment is not limited thereto.

In this case, the first-group gallium nitride-based superlattice layer 121 may include a first-group well 121w and a first-group barrier 121b, the second-group gallium nitride-based superlattice layer 122 may include a second-group well 122w and a second-group barrier 122b, and the third-group gallium nitride-based superlattice layer 123 may include a third-group well 123w and the third-group barrier 123b.

The gallium nitride-based superlattice layer 124 may include an $In_xGa_{(1-x)}N$/GaN superlattice layer (where, 0<x<1), and the difference D between a first bandgap energy level and a second bandgap energy level may be equal to or higher than a photon energy level of the gallium nitride-based superlattice layer.

For example, only when the difference (energy difference) of a well depth in the gallium nitride-based superlattice layer belonging to each group is equal to or higher than the phonon energy (about 88 meV) of InGaN, a portion of the energy of hot electrons may be transferred in the form of the phonon energy.

The gallium nitride-based superlattice layer 124 according to the embodiment may have at least two energy steps and the depth of a quantum well (multi-quantum well) 114w of the active layer 114 is about 200 meV, so a plurality of energy steps can be provided and the number of the energy steps may be determined by dividing the depth of the quantum well by the minimum phonon energy.

According to the embodiment, the energy level of each group may be adjusted by adjusting the concentration of In contained in the well of each group.

For example, the concentration of In contained in the second-group gallium nitride-based superlattice layer 122 may be set to a value higher than that of In contained in the first-group gallium nitride-based superlattice layer 121, thereby reducing the energy level of the second-group well 122w to lower than the energy level of the first-group well 121w.

According to the embodiment, hot electrons are cooled by the gallium nitride-based superlattice layer having a plurality of energy steps, so that a high-power light-emitting device having an effective electron injection layer can be provided.

According to the embodiment, the thickness of each group of the GaN-based superlattice layer may be controlled in order to enhance the electron injection efficiency by more efficiently cooling the hot electrons.

For example, the thickness of the first-group gallium nitride-based superlattice layer 121 may be thinner than the thickness of the second-group gallium nitride-based super lattice layer 122.

In this case, the thickness of the first-group well 121w provided in the first-group gallium nitride-based superlattice layer 121 may be equal to the thickness of the first-group barrier 121b provided in the first-group gallium nitride-based superlattice layer 121 and the first-group well 121w and the first-group barrier 121b may be prepared in a plurality of cycles. For example, the first-group well 121w and the first-group barrier 121b may be controlled to have an equal thickness in the range of about 1 nm to 3 nm and may be prepared in a plurality of cycles so that the hot carriers can be effectively cooled as compared with a case where a single thick well and a single thick barrier are provided.

In addition, the second-group well 122w and the second-group barrier 122b provided in the second-group gallium nitride-based superlattice layer 122 may be controlled to have an equal same thickness in the range of about 1 nm to 3 nm and may be prepared in a plurality of cycles so that the cooling of the hot carriers can be induced as compared with a case where a single thick well and a single thick barrier are provided.

In this case, the thickness of the second-group well 122w may be equal to the thickness of the first-group well 121w and the thickness of the second-group barrier 122b may be equal to the thickness of the first-group barrier 121b. Thus, even if the carriers recognize a predetermined energy barrier in the gallium nitride-based superlattice layer, the carriers may not be extinguished within the gallium nitride-based superlattice layer due to the well and the barrier having the regular thickness, so that the carriers can be smoothly injected.

According to the embodiment, the total thickness of the second-group gallium nitride-based superlattice layer 122 may be thicker than the total thickness of the first-group gallium nitride-based superlattice layer 121. For example, the second-group gallium nitride-based superlattice layer 122 may include the second-group well 122w and the second-group barrier 122b repeatedly formed in about 8 to 12 cycles and the first-group gallium nitride-based superlattice layer 121 may include the first-group well 121w and the first-group barrier 121b repeatedly formed in about 3 to 5 cycles.

According to the embodiment, the hot carriers can be stably cooled for longer time in the second-group gallium nitride-based superlattice layer 122 that meets partiallycooled hot carriers rather than the first-group gallium nitride-based superlattice layer 121 that primarily meets the hot carriers, so the hot carriers may be efficiently cooled, thereby preventing the hot carriers from being overflowed.

In addition, according to the embodiment, the thickness of the third-group well 123w in the third-group gallium nitride-based superlattice layer 123 may be equal to the thickness of the second-group well 122w and thinner than the thickness of the third-group barrier 123b.

For example, the thickness of the third-group well 123w may be in the range of about 1 nm to about 3 nm, and the thickness of the third-group barrier 123b may be in the range of about 7 nm to about 11 nm, but the embodiment is not limited thereto.

According to the embodiment, the third-group barrier 123b may be adjacent to the active layer 114, and the thickness of the third-group barrier 123b, which is the final barrier, may be thicker than that of the barriers and wells of other groups.

According to the embodiment, the third-group barrier 123b may be doped with a first conductive element to improve the electron injection efficiency In addition, according to the embodiment, an undoped GaN layer 125 is further provided between the third-group barrier 123b and the quantum well 114w of the active layer 114 to prevent the first conductive element doped in the third-group barrier 123b from diffusing into the active layer 114 and blocking the recombination for light emission.

According to the embodiment, the hot electrons are cooled by the gallium nitride-based superlattice layer having a plurality of energy steps, so that the high-power light-emitting device having the effective electron injection layer can be provided.

Thereafter, referring to FIG. 1, the second conductivity type semiconductor layer 116 is formed on the second conductive gallium nitride-based layer 129.

The second conductivity type semiconductor layer 116 may include a semiconductor compound. The second conductivity type semiconductor layer 116 may be realized by using groups III-V-II-VI compound semiconductors, and may be doped with second conductivity type dopants.

For example, the second conductivity type semiconductor layer 116 may include a semiconductor material having a compositional formula of $In_xAl_yGa_{1-x-y}N$ ($0 \leq x \leq 1$, $0 \leq y \leq 1$, and $0 \leq x+y \leq 1$). If the second conductivity type semiconductor layer 116 is a P type semiconductor layer, the second conductive dopant, which serves as a P type dopant, may include Mg, Zn, Ca, Sr, or Ba.

Thereafter, the second conductivity type semiconductor layer 116 may be provided thereon with a transmissive electrode 130. The transmissive electrode 130 may include a transmissive ohmic layer, and may be formed by laminating single metal, or by laminating a metal alloy and metal oxide in a multi-layer such that carrier injection may be efficiently performed.

The transmissive electrode 130 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO(In—Ga ZnO), ZnO, IrOx, RuOx, and NiO, but the embodiment is not limited thereto.

According to the embodiment, the first conductivity type semiconductor layer 112 may include an N type semiconductor layer and the second conductivity type semiconductor layer 116 may include a P type semiconductor layer, but the embodiment is not limited thereto. In addition, a semiconductor layer, such as an N type semiconductor layer (not illustrated) having polarity opposite to that of the second conductivity type semiconductor layer 116, may be formed on the second conductivity type semiconductor layer 116. Thus, the light emitting structure 110 may include one of an N-P junction structure, a P-N junction structure, an N-P-N junction structure, and a P-N-P junction structure.

Subsequently, as shown in FIG. 7, portions of the transmissive electrode 130, the second conductivity type semiconductor layer 116, the second conductive gallium nitride-based layer 129, the active layer 114, and the gallium nitride-based superlattice layer 124 may be removed to expose the first conductivity type semiconductor layer 112.

Then, a second electrode 132 is formed on the transmissive electrode 130, and a first electrode 131 is formed on the first conductivity type semiconductor layer 112 that is exposed.

According to the embodiment, the light-emitting device having the optical structure capable of improving luminous intensity, a method of manufacturing the same, a light-emitting device package, and a lighting system can be provided FIG. 11 is a sectional view showing a light-emitting device package 200 having the light-emitting device according to the embodiments.

The light-emitting device package 200 according to the embodiment includes a package body 205, third and fourth electrode layers 213 and 214 installed in the package body 205, a light-emitting device 100 installed in the package body 205 and electrically connected with the third and fourth electrode layers 213 and 214, and a molding member 230 to surround the light-emitting device 100.

The package body 205 may include a silicon material, a synthetic resin material, or a metallic material. The package body 205 may have an inclination surface formed at a peripheral portion of the light-emitting device 100.

The third and fourth electrode layers 213 and 214 are electrically isolated from each other and supply power to the light-emitting device 100. In addition, the third and fourth electrode layers 213 and 214 may reflect light emitted from the light-emitting device 100 to increase the light efficiency, and discharge the light emitted from the light-emitting device 100 to the outside.

The light-emitting device 100 may include a lateral-type light-emitting device shown in FIGS. 1, 6, and 9, but the embodiment is not limited thereto. In other words, the light-emitting device may include a vertical type light-emitting device, or a flip-chip light-emitting device.

The light-emitting device may be installed in the package body 205, or may be installed on the third electrode layer 213 or the fourth electrode layer 214.

The light-emitting device 100 may be electrically connected with the third electrode layer 213 and/or the fourth electrode layer 214 through one of a wire scheme, a flip-chip scheme, or a die-bonding scheme. According to the embodiment, the light-emitting device 100 is electrically connected with the third electrode layer 213 through a wire 230, and electrically connected with the fourth electrode layer 214 in the direct contact with the fourth electrode layer 214 for the illustrative purpose.

The molding member 230 may protect the light-emitting device 100 by surrounding the light-emitting device 100. In addition, a phosphor 232 is included in the molding member 230 to change the wavelength of the light emitted from the light-emitting device 100.

FIGS. 12 to 14 are views showing a lighting device including a light-emitting device according to the embodiment FIG. 12 is a perspective view showing the lighting device according to the embodiment when viewed from the top of the lighting device. FIG. 13 is a perspective view showing the lighting device according to the embodiment when viewed from the bottom of the lighting device. FIG. 14 is an exploded perspective view showing the lighting device of FIG. 13.

Referring to FIGS. 12 to 14, the lighting device according to the embodiment may include a cover 2100, a light source module 2200, a radiator 2400, a power supply part 2600, an inner case 2700, and a socket 2800. In addition, the lighting device according to the embodiment may further include at least one of a member 2300 and a holder 2500. The light source module 2200 may include the light-emitting device 100 or the light-emitting device package according to the embodiment.

For example, the cover 2100 may have a blub shape, a hemisphere shape, a partially-open hollow shape. The cover 2100 may be optically coupled to the light source module 2200. For example, the cover 2100 may diffuse, scatter, or excite light provided from the light source module. The cover 2100 may be a type of optical member. The cover 2100 may be coupled to the radiator 2400. The cover 2100 may include a coupling part which is coupled to the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

A material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the light source module 2200, to the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed of an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be narrower than or equal to a width of the connection part 2750 of the inner case 2700. Terminals of a "+ electric wire" and a "− electric wire" are electrically connected to the extension part 2670 and terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

INDUSTRIAL APPLICABILITY

Light-emitting device packages according to the embodiment may be arrayed on a substrate, and a light guide plate, a prism sheet, a diffusion sheet, and a fluorescent sheet may be provided on the path of light emitted from the light-emitting device package. The light-emitting device package, the substrate, and the optical member may serve as a backlight unit or a lighting unit. For example, the lighting system may include a backlight unit, a lighting unit, an indication device, a lamp, and a street lamp.

According to the embodiment, the light-emitting device having the optimal structure capable of enhancing the light intensity, the method of manufacturing the same, the light-emitting device package, and the lighting system can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light-emitting device comprising:
   a first conductivity type semiconductor layer;
   a gallium nitride-based superlattice layer on the first conductivity type semiconductor layer;
   an active layer on the gallium nitride-based superlattice layer;
   a second conductivity type gallium nitride-based layer on the active layer; and
   a second conductivity type semiconductor layer on the second conductivity type gallium nitride-based layer,
   wherein the second conductivity type gallium nitride-based layer comprises:
   a second conductivity type $Al_xGa_{(1-x)}N/Al_yGa_{(1-y)}N$ superlattice layer (where, $0<x<1$, $0<y<1$) on the active layer,
   wherein a concentration (x) of Al in $Al_xGa_{(1-x)}N$ is higher than a concentration (y) of Al in $Al_yGa_{(1-y)}N$ in the second conductivity type $Al_xGa_{(1-x)}N/Al_yGa_{(1-y)}N$ superlattice layer,
   wherein the second conductivity type $Al_xGa_{(1-x)}N/Al_yGa_{(1-y)}N$ superlattice layer has a plurality of cycles,
   wherein the gallium nitride-based superlattice layer has a bandgap energy level which varies from the first conductivity type semiconductor layer toward the active layer, and
   wherein the gallium nitride-based superlattice layer comprises:
   a first-group gallium nitride-based superlattice layer having a first bandgap energy; and
   a second-group gallium nitride-based superlattice layer having a second bandgap energy lower than the first bandgap energy on the first-group gallium nitride-based superlattice layer; and
   a third-group gallium nitride-based superlattice layer having a third bandgap energy on a second-group gallium nitride-based superlattice layer,
   wherein the second conductivity type $Al_xGa_{(1-x)}N/Al_yGa_{(1-y)}N$ superlattice layer comprises a first second conductivity type $Al_{x1}Ga_{(1-x1)}N/Al_yGa_{(1-y)}N$ superlattice layer, a second conductivity type $Al_{x2}Ga_{(1-x2)}N/Al_yGa_{(1-y)}N$ superlattice layer, a third second conductivity type $Al_{x3}Ga_{(1-x3)}N/Al_yGa_{(1-y)}N$ superlattice layer, and a fourth second conductivity type $Al_{x4}Ga_{(1-x4)}N/Al_yGa_{(1-y)}N$ superlattice layer that are sequentially laminated,
   wherein a concentration (x1) of Al in $Al_{x1}Ga_{(1-x1)}N$ of the first second conductivity type $Al_xGa_{(1-x)}N/Al_yGa_{(1-y)}N$ superlattice layer, a concentration (x2) of Al in $Al_{x2}Ga_{(1-x2)}N$ of the second conductivity type $Al_{x2}Ga_{(1-x2)}N/Al_yGa_{(1-y)}N$ superlattice layer, a concentration (x3) of Al in $Al_{x3}Ga_{(1-x3)}N$ of the third second conductivity type $Al_{x3}Ga_{(1-x3)}N/Al_yGa_{(1-y)}N$ superlattice layer, and a concentration (x4) of Al in $Al_{x4}Ga_{(1-x4)}N$ of the fourth second conductivity type $Al_{x4}Ga_{(1-x4)}N/Al_yGa_{(1-y)}N$ superlattice layer are different, and
   wherein the first-group gallium nitride-based superlattice layer has a thickness less than a thickness of the second-group gallium nitride-based superlattice layer.

2. The light-emitting device of claim 1, wherein the concentration (x) of the Al in the $Al_xGa_{(1-x)}N$ is varies from the active layer toward the second conductivity type semiconductor layer, and the concentration (y) of the Al in the $Al_yGa_{(1-y)}N$ is constant.

3. The light-emitting device of claim 1, wherein the concentration (x1) of Al in $Al_{x1}Ga_{(1-x1)}N$ of the first second conductivity type $Al_{x1}Ga_{(1-x1)}N/Al_yGa_{(1-y)}N$ superlattice layer is lower than the concentration (x2) of Al in $Al_{x2}Ga_{(1-x2)}N$ of the second conductivity type $Al_{x2}Ga_{(1-x2)}N/Al_yGa_{(1-y)}N$ superlattice layer, and
   wherein the concentration (x4) of Al in $Al_{x4}Ga_{(1-x4)}N$ of the fourth second conductivity type $Al_{x4}Ga_{(1-x4)}N/Al_yGa_{(1-y)}N$ superlattice layer is lower than the concentration (x3) of Al in $Al_{x3}Ga_{(1-x3)}N$ of the third second conductivity type $Al_{x3}Ga_{(1-x3)}N/Al_yGa_{(1-y)}N$ superlattice layer.

4. The light-emitting device of claim 1, wherein the second conductivity type gallium nitride-based layer comprises:
   a second conductivity type $In_xAl_yGa_{(1-x-y)}N$ layer (where, $0<x<1$, $0<y<1$) (127) having a second concentration of second conductivity type impurities on the active layer;
   a second conductivity type GaN layer having a first concentration of second conductivity type impurities on the second conductivity type $In_xAl_yGa_{(1-x-y)}N$ layer having the second concentration; and
   the second conductivity type $Al_xGa_{(1-x)}N/Al_yGa_{(1-y)}N$ superlattice layer on the second conductivity type GaN layer having the first concentration.

5. The light-emitting device of claim 4, wherein the second conductivity type $Al_xGa_{(1-x)}N/Al_yGa_{(1-y)}N$ superlattice layer is a second conductivity type $Al_xGa_{(1-x)}N/Al_yGa_{(1-y)}N$ superlattice layer having a third concentration of second conductivity type impurities, and the first concentration is higher than the second concentration and the third concentration.

6. The light-emitting device of claim 1, wherein the concentration (x) of the Al in the $Al_xGa_{(1-x)}N$ and the concentration (y) of the Al in the $Al_yGa_{(1-y)}N$ are constant.

* * * * *